(12) United States Patent
Fischer

(10) Patent No.: US 6,456,119 B2
(45) Date of Patent: Sep. 24, 2002

(54) DECODING APPARATUS

(75) Inventor: Helmut Fischer, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/789,784

(22) Filed: Feb. 20, 2001

(30) Foreign Application Priority Data

Feb. 17, 2000 (DE) .......................................... 100 07 176

(51) Int. Cl.⁷ .......................................... H03K 19/0175
(52) U.S. Cl. .......................... 326/105; 326/83; 326/89
(58) Field of Search .............................. 326/83, 86, 89, 326/90, 105

(56) References Cited

U.S. PATENT DOCUMENTS

| 5,242,850 A | 9/1993 | Tasaka |
| 6,046,627 A | 4/2000 | Itoh |

FOREIGN PATENT DOCUMENTS

| EP | 0 328 168 B1 | 8/1989 |
| EP | 0 759 618 A2 | 2/1997 |
| JP | 10-242839 A | 9/1998 |

OTHER PUBLICATIONS

Millman et al, Microelectronics, 1987, McGraw–Hill, pp. 145–151.*

* cited by examiner

*Primary Examiner*—Don Phu Le
(74) *Attorney, Agent, or Firm*—Laurence A. Greenberg; Werner H. Stemer; Gregory L. Mayback

(57) ABSTRACT

A decoding apparatus for transmitting a high voltage signal includes a final decoder for switchably transmitting a transmission signal. The final decoder has a switching device that has at least one depletion-mode-type field effect transistor and/or field effect transistor having a low threshold voltage (i.e., 0.1 to 0.4 V), in particular, a low VT field effect transistor. A transmission signal line supplies the transmission signal to the decoder, a driver signal line supplies a driver signal to the decoder, and an output signal line outputs an output signal from the decoder. The driver signal line applies the driver signal to the gate line, the transmission signal line applies the transmission signal to the source line. The field effect transistor is configured to selectively connect the output signal to the output signal line device through the output in response to a reset of the driver signal. The configuration reduces the likelihood of channel degradation and of failure in the field effect transistor.

25 Claims, 4 Drawing Sheets

DECODING APPARATUS

BACKGROUND OF THE INVENTION

Field of the Invention

The invention relates to a decoding apparatus for transmitting a high voltage signal.

In the fields of microelectronics, information technology, and the like, it is often necessary to code and/or decode a multiplicity of addresses for electronic components in hardware. Such coding/decoding is performed in order to address memory elements, sensor elements, e.g., in image sensors, actuator elements, or the like, and, consequently, to call up their contents in order to read them, change their state, or the like.

In particular, in the case of memory chips, such as DRAMs, it is customary to select individual word lines from predecoded addresses in a word line decoder. In such a context, in prior art decoding apparatuses, in particular, for transmitting high voltage signals, a final decoder is provided for the switchable transmission of a transmission signal. In addition, a transmission signal line device is configured to supply the transmission signal to the final decoder, and a driver signal line device is configured to supply a driver signal to the final decoder. Also, an output signal line device is configured to output an output signal from the final decoder. The final decoder has a first switching device, with at least one field effect transistor as the switching element. In these prior art decoding apparatuses, the gate line of the respective field effect transistor can have the driver signal applied to it, and the respective source line can have the transmission signal applied to it, specifically such that, when the driver signal is reset—e.g., from high to low, the output signal can be connected to the output signal line device and appears there.

Thus, the effect achieved in the prior art decoding apparatus is that a high voltage output signal appears at the output of the final decoder if the corresponding driver signal on the gate line changes from high to low.

There is a disadvantageous aspect of the construction of these prior art decoding apparatuses, particularly when high voltage signals are being transmitted, because particular circumstances do not allow the temporal relationship, that is to say, in particular, the time interval, between the high/low change of the driver signal and the low/high change of the transmission signal to be observed. Such observation is not allowed because, if the driver signal changes to low while the output signal is already rising or has already risen, the output characteristic curve of the appropriate field effect transistor would be traversed from the saturation region to the resistance region, that is to say under load. In such a context, however, high channel voltages in the transmission channel may arise in the saturation region, and, consequently, there is a high likelihood that the line channel of the transistor will be degraded. The channel degradation is based to a considerable extent on the fact that hot electrons at the semiconductor/insulator interface, in particular, the $Si/SiO_2$ interface, cause faults. These faults can result in the threshold voltage being shifted and in the channel mobility being reduced. Degradation of the transistor and its consequential phenomena increase the likelihood of a permanent change in the transistor properties and in its switching response, and the likelihood of failure also increases. Hence, there is also the possibility of damage to the component, to the memory chip, or the like.

SUMMARY OF THE INVENTION

It is accordingly an object of the invention to provide a decoding apparatus that overcomes the hereinafore-mentioned disadvantages of the heretofore-known devices of this general type and in which the likelihood of damage and of failure when high voltage signals are being transmitted is particularly small.

With the foregoing and other objects in view, there is provided, in accordance with the invention, a decoding apparatus for transmitting a high voltage signal, including a final decoder for switchably transmitting a transmission signal, the final decoder having a switching device, a transmission signal line device configured to supply the transmission signal to the final decoder, a driver signal line device configured to supply a driver signal to the final decoder, and an output signal line device configured to output an output signal from the final decoder, the switching device having at least one field effect transistor with a gate line, a source line, and an output, the at least one field effect transistor having a low threshold voltage, the driver signal line device connected to the gate line for applying the driver signal to the gate line, the transmission signal line device connected to the source line for applying the transmission signal to the source line, the output signal line device selectively connected to the output, and the at least one field effect transistor configured to selectively connect the output signal to the output signal line device through the output in response to a reset of the driver signal.

The first way in which the invention achieves its objectives is for the field effect transistor in the first switching device of the final decoder to be respectively constructed to have a low threshold voltage, to wit, between 0.1 and 0.4 volts. The effect achieved by the low threshold voltage is that, when the driver signal changes from high to low, the field effect transistor is actually taken as early as possible, i.e., without any load, from the saturation region into the resistance region, so that the smallest possible time overlap between the high/low change in the driver signal and the low/high change in the transmission signal results. Therefore, the likelihood of channel degradation is reduced.

In such a case, it is particularly advantageous that the respective field effect transistor in the first switching device of the final decoder is a low VT field effect transistor.

With the objects of the invention in view, there is also provided a decoding apparatus for transmitting a high voltage signal, including a final decoder for switchably transmitting a transmission signal, the final decoder having a switching device, a transmission signal line device configured to supply the transmission signal to the final decoder, a driver signal line device configured to supply a driver signal to the final decoder, and an output signal line device configured to output an output signal from the final decoder, the switching device having at least one depletion-mode-type field effect transistor with a gate line, a source line, and an output, the driver signal line device connected to the gate line for applying the driver signal to the gate line, the transmission signal line device connected to the source line for applying the transmission signal to the source line, the output signal line device selectively connected to the output, and the at least one field effect transistor configured to selectively connect the output signal to the output signal line device through the output in response to a reset of the driver signal.

In accordance with a further way in which the invention achieves the object, provision is made for the field effect transistor in the first switching device of the final decoder to be respectively a depletion mode field effect transistor, in particular, a depletion mode PFET. The configuration likewise increases the likelihood that, in the event of a time overlap between a falling driver signal and a rising transmission signal, the transistor operates in the resistance region, and, therefore, outside the saturation region, at an earlier instant. As a result, the time overlap and, hence, the likelihood of channel degradation are reduced. Preferably, the depletion mode type field effect transistor has a low threshold voltage, preferably, between 0.1 and 0.4 volts. In particular, the depletion mode field effect transistor is a normally-on, depletion mode field effect transistor.

It can be regarded as a further advantage that the field effect transistor in the first switching device of the final decoder is respectively configured as a field effect transistor of the depletion mode type having a low threshold voltage, i.e., between 0.1 and 0.4 V. The configuration also ensures that the field effect transistor switches early so that it operates in the resistance region as soon as possible, further reducing the likelihood of channel degradation as a result of operation in the saturation region under load.

Both of the invention's ways of achieving its objectives have the additional advantage that—particularly in the case of the depletion mode PFET—the current yield is increased. Increasing the current yield means that the respective field effect transistor can be smaller or have smaller proportions, which, in particular, also becomes noticeable in the fact that the transistor in question has a smaller physical size. The reduction becomes clear, in particular, when one considers that a multiplicity of homogeneous switching transistors need to be produced on one memory chip, for example, in a corresponding decoding apparatus.

In accordance with another feature of the invention, the respective field effect transistor in the first switching device of the final decoder is a p-channel-conductive field effect transistor, and, preferably, is a normally-on-type p-channel-conductive field effect transistor.

In accordance with a further feature of the invention, there is provided a driver device that generates the driver signal and outputs it on the driver signal line device. Such a configuration ensures that the data supplied to the decoding apparatus permits a driver signal for selecting and calling up the appropriate word line to output the independently generated output signal.

In accordance with an added feature of the invention, there is provided a predecoder configured to receive and predecode a supplied address signal and to generate and supply a driver control signal to the driver signal line device.

Such a context provides a particular advantage. An appropriate predecoder is produced that is configured to receive and predecode a supplied address signal and to generate and supply a driver control signal, in particular, to the driver device. Thus, the supplied addresses are evaluated in advance by predecoding. In addition, to control the driver device, an appropriate driver control signal is generated and is output to the driver device.

In accordance with an additional feature of the invention, there is provided a reset signal line device that is configured to supply a reset signal to the final decoder.

In accordance with yet another feature of the invention, there is provided a second switching device—in particular in the final decoder—that can reset the output signal line device, in particular, to a zero potential.

The effect achieved is that the output signal line device or a component thereof is set to a defined potential in response to the reset signal being supplied, so that, in particular, no output signal at all appears on the output signal line device or on an individual line or component thereof. Consequently, the reset signal can disconnect the output signal line device or a component thereof in a defined manner.

To such an end, in one preferred embodiment, the second switching device has a field effect transistor whose gate line is configured to receive the reset signal and whose source line is configured for connection to the output signal line device or a component thereof.

The embodiments described hitherto characterize the fundamental configuration of the proposed decoding apparatus for transmitting a high voltage signal. The measures discussed above are particularly advantageous due to the fact that, in memory chips or the like, for example, the proposed measures are adopted or produced with a high level of multiplicity, because the corresponding line devices have a multiplicity of individual line components or individual lines having corresponding individual addresses or individual address signals. Consequently, for a plurality of individual lines, corresponding switching elements in the form of essentially identical field effect transistors also need to be produced.

Accordingly, in one preferred embodiment of the decoding apparatus according to the invention, the transmission signal line device, the output signal line device, and the driver signal line device each have a plurality of individual lines, namely transmission signal lines, output signal lines, and driver signal lines, for the parallel transmission of a respective signal component. In addition, the first switching device has a corresponding plurality of field effect transistors, in particular, normally-on, field effect transistors, a respective gate line of a particular field effect transistor is connected to a respective driver signal line, and a respective source line of the particular field effect transistor is connected to a respective transmission signal line, in order to transmit a respective component of the output signal such that it can be connected to an output signal line in parallel.

Due to the multiplicity of the line devices and of the switching elements, a concomitant feature of the invention provides for the reset signal line device to have a corresponding plurality of reset signal lines for supplying reset signal components, and for the second switching device to contain a corresponding plurality of field effect transistors for resetting the respective output signal lines.

The multiplicity of the second switching device and of the field effect transistors provided in it, in particular, further saves space. The depletion mode type field effect transistors are also able to transmit voltages in a region of 0 volts. Thus, the respective field effect transistor in the second switching device—that is to say, the transistor for resetting the output signal line—can be reduced in size. Such reduction also results in a further saving of space.

Basic concepts of the decoding apparatus according to the invention are, thus, not to provide a conventional PMOS field effect transistor as a switching transistor, but to provide a respective field effect transistor having little likelihood of channel degradation when high voltage signals are transmitted, in particular, when there is a time overlap between the high/low change in the driver signal and the low/high change in the output signal. Such a configuration reduces the susceptibility to malfunctions and the likelihood of failure. In addition, the physical proportions of the field effect transistors in the first switching device and also in the second switching devices can be reduced, which results in space savings on the semiconductor modules.

Other features that are considered as characteristic for the invention are set forth in the appended claims.

Although the invention is illustrated and described herein as embodied in a decoding apparatus, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENT

Figure 1:
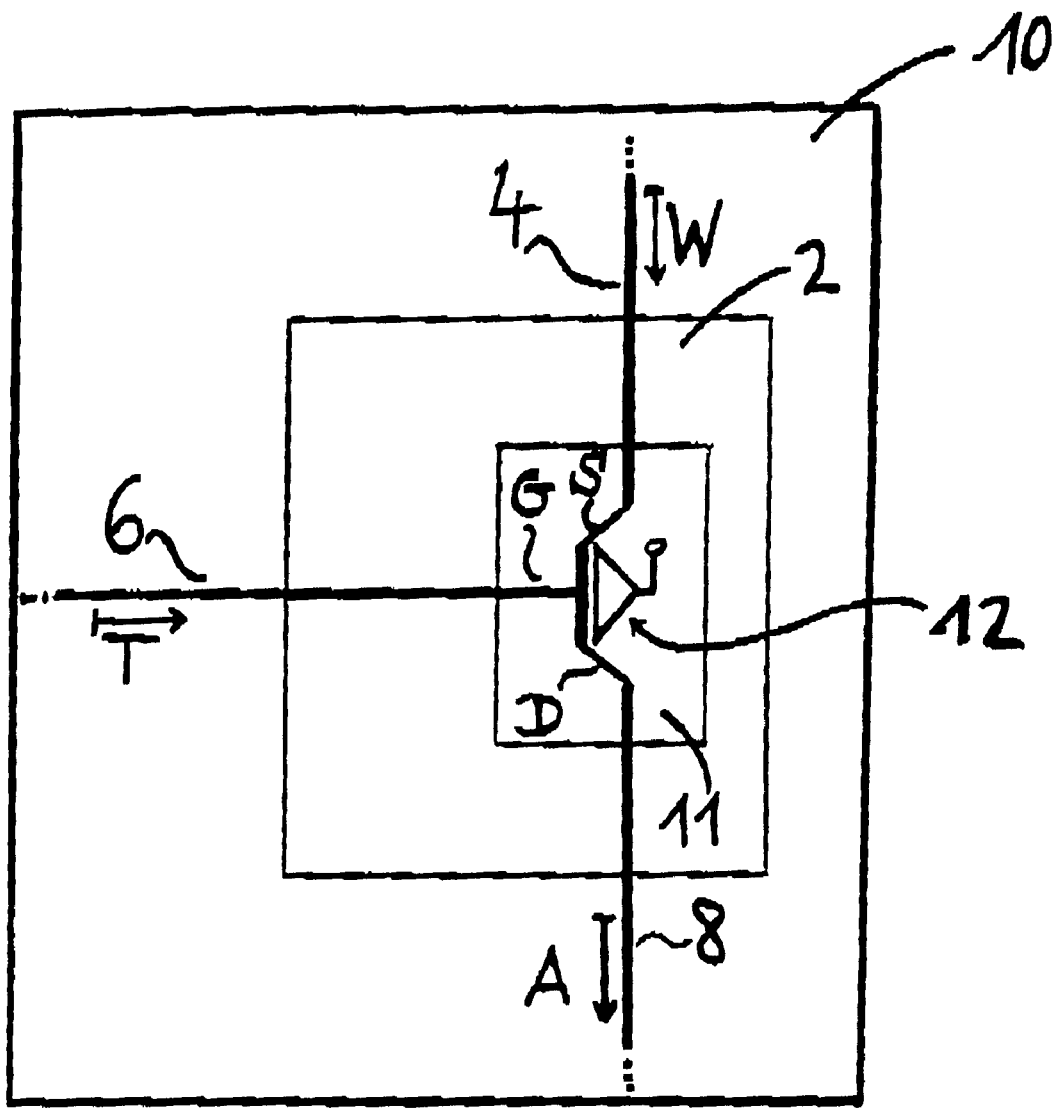
FIG. 1 is a schematic circuit diagram of a first embodiment of the decoding apparatus according to the invention.

In all the figures of the drawing, sub-features and integral parts that correspond to one another bear the same reference symbol in each case.

Referring now to the figures of the drawings in detail and first, particularly to FIG. 1 thereof, there is shown a first illustrative embodiment of the decoding apparatus 10 according to the invention.

The decoding apparatus includes a final decoder 2, to which a transmission signal W is supplied through a transmission signal line device 4, and to which a driver signal T is supplied through a driver signal line device 6. The decoding apparatus 10 according to the invention has a first switching device 11 in its final decoder 2 for the switchable transmission of the transmission signal W from the transmission signal line device 4 to the output signal line device 8 as output signal A. The first switching device 11 includes at least one, in particular, normally-on, field effect transistor 12 whose gate line G is connected just to the driver signal line device 6 and whose source line S is connected just to the output signal line device 4. A high/low change in the driver signal T on the driver signal line device 6 causes the field effect transistor 12 to connect the transmission signal W on the transmission signal line device 4 to the source line S through its drain line D as output signal A on the output signal line device 8.

Figure 2:
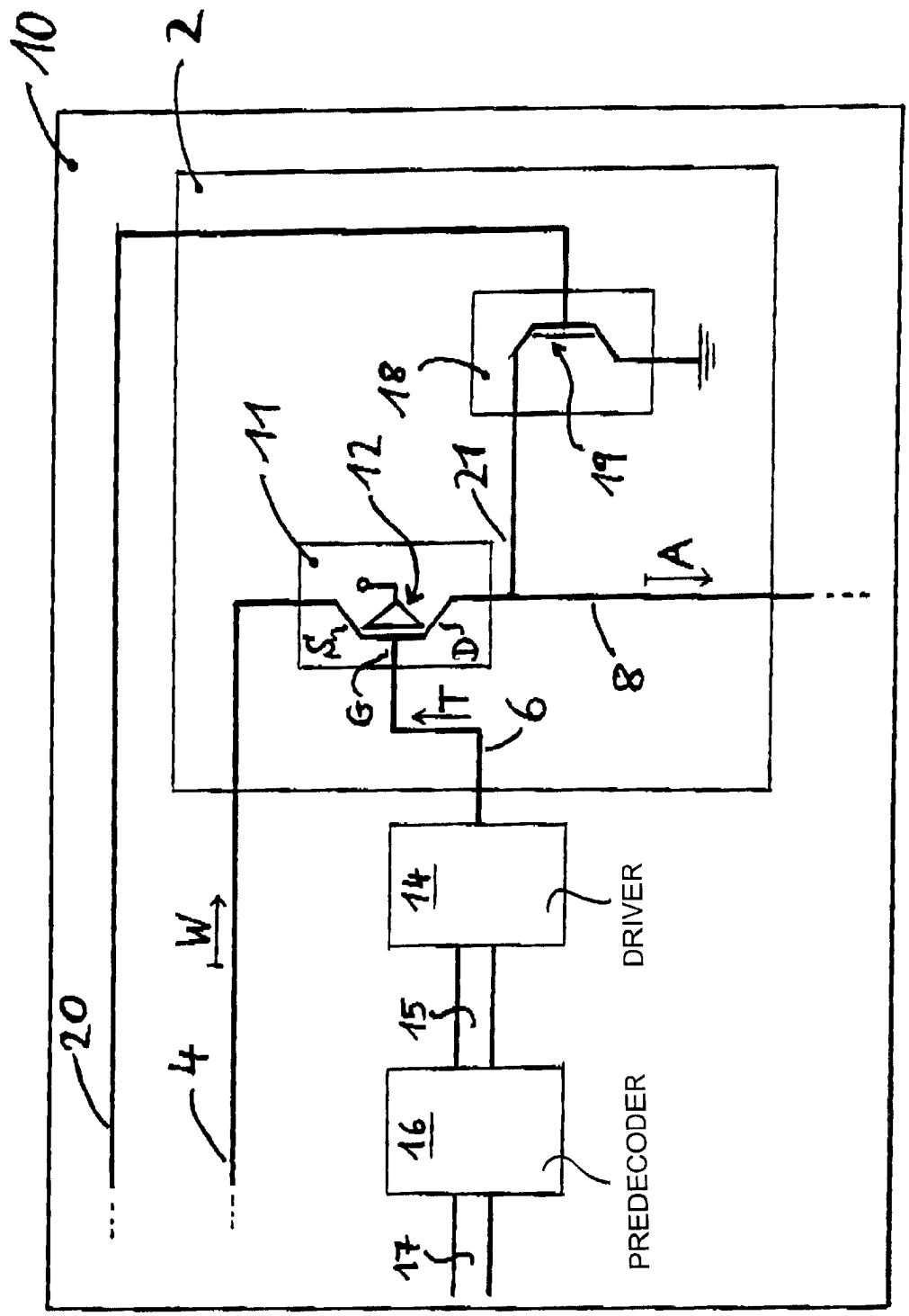
FIG. 2 is a schematic circuit diagram of a second embodiment of the decoding apparatus according to the invention.

The schematic block diagram in FIG. 2 illustrates a second embodiment of the decoding apparatus 10 according to the invention, where the internal configuration of the first switching device 11, having the field effect transistor 12, and the incoming/outgoing line devices 4, 6, 8 connected to the source, gate, and drain lines S, G, D are identical to those in the first embodiment of FIG. 1.

A driver device 14 generates and outputs the driver signal T applied to the driver signal line device 6. A predecoder 16 controls the driver device 14. The predecoder 16 receives appropriate address signals through an external address bus 17 and, for its part, supplies a generated driver control signal to the driver device 14 on a control bus 15.

The final decoder 2 includes the second switching device 18 having a respective field effect transistor 19. The gate line of the field effect transistor 19 is connected to a reset signal line device 20. In response to a reset signal on the reset signal line device 20, the field effect transistor 19 connects the output signal line device 8, which is connected to the field effect transistor's 19 source line 21, to the potential that is present on its drain line, in this case, ground. Thus, the reset signal on the reset signal line device 20 causes the output signal line device 8 or a component thereof to be reset or disconnected.

Figure 3:
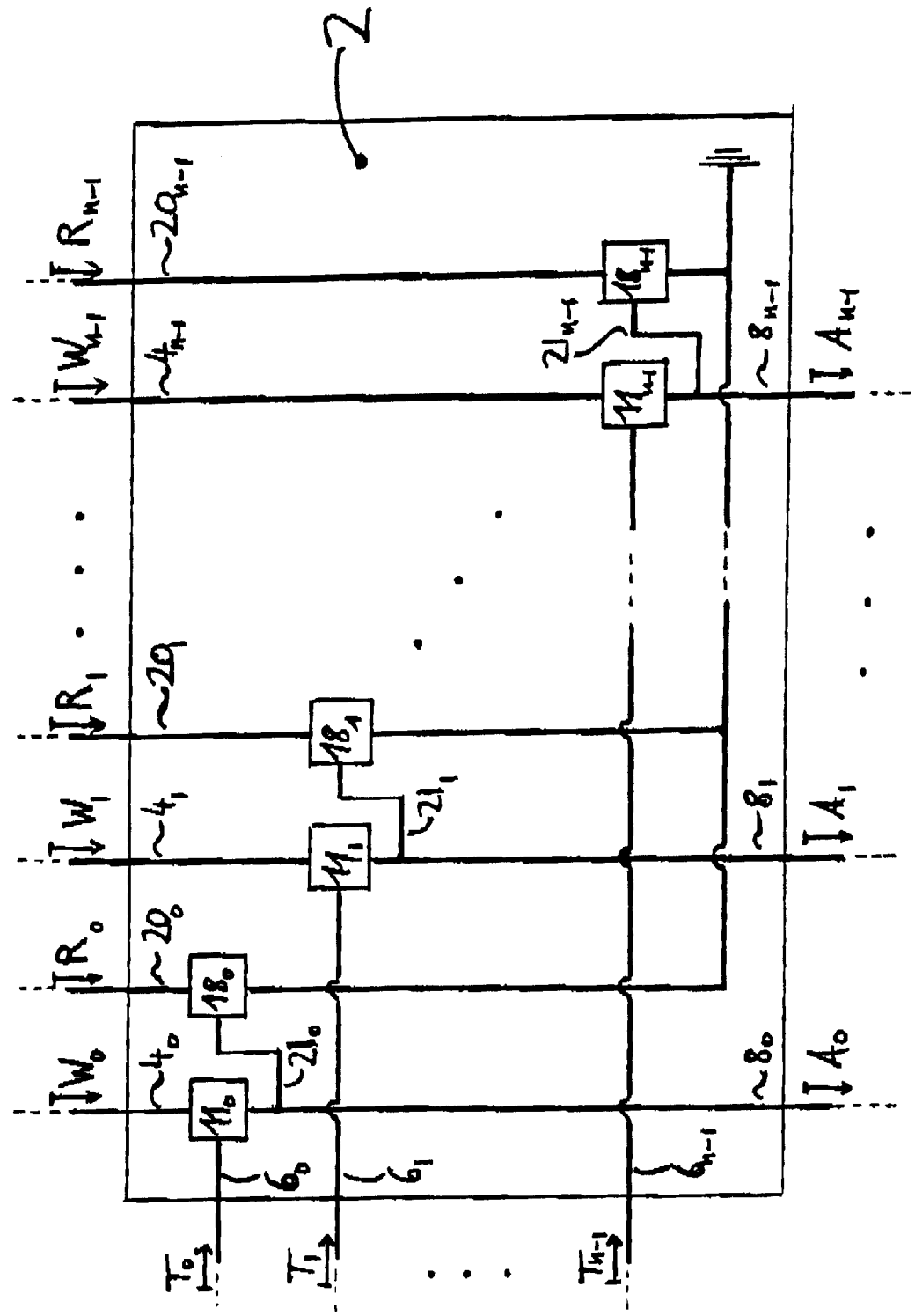
FIG. 3 is a schematic block diagram of a third embodiment of the decoding apparatus according to the invention.

The schematic block diagram in FIG. 3 shows a third illustrative embodiment of the decoding apparatus 10 according to the invention and, in particular, details of the final decoder 2 in terms of the multiplicity of the line devices 4, 6, 8 and of the corresponding switching devices 11, 18.

The final decoder 2 in the embodiment of the decoding apparatus 10 according to the invention has n first switching devices $11_0, \ldots, 11_{n-1}$ and n second switching devices $18_0, \ldots, 18_{n-1}$. Each of the first switching devices $11_j$ is connected to a transmission signal line $4_j$, to a driver signal line $6_j$, and to an output signal line $8_j$. Thus, the transmission signal line device 4, the driver signal line device 6, and the output signal line device 8 each include n components or individual lines, namely $4_0, \ldots, 4_{n-1}$ and $6_0, \ldots, 6_{n-1}$ and $8_0, \ldots, 8_{n-1}$. These individual lines are used to transmit appropriate transmission signal components $W_j$, driver signal components $T_j$, and output signal components $A_j$, where $j=0, \ldots, n-1$.

The output signal lines $8_j$ are connected to the individual second switching devices $18_j$ through lines $21_j$. The individual second switching devices $18_j$ receive appropriate reset signals $R_j$ through individual reset signal lines $20_j$, and the output signal lines $8_j$ can then be reset to a common external potential, e.g., ground.

Figure 4:
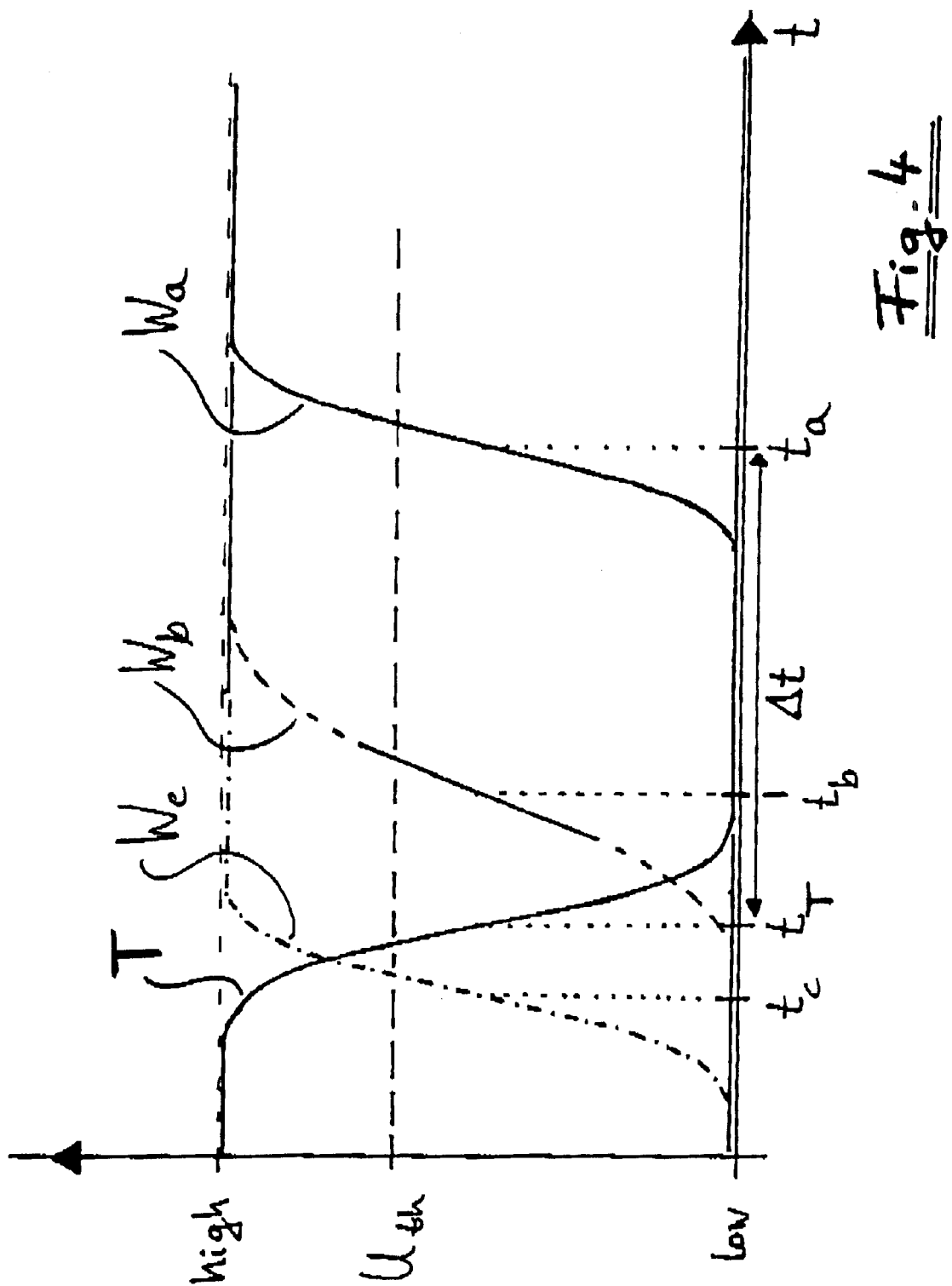
FIG. 4 is a graph illustrating a time sequence of a driver signal and a transmission signal according to the invention.

FIG. 4 is a graph showing, schematically, the temporal relationship between the driver signal T on the driver signal line device 6 and the transmission signal W on the transmission signal line device 4 for three different transmission signals $W_a$, $W_b$, $W_c$.

The driver signal T shown in FIG. 4 is high in its inactive state and low in its active state. At an instant $t_T$, the driver signal T shown in FIG. 4 changes from its inactive state to its active state, that is to say from high to low.

Similarly, the signal $W_a$, which is to be transmitted, changes from low to high at another instant $t_a$. The corresponding changes are, in principle, not purely of a stepped nature; the signals have a certain transition width and a particular rising or falling edge.

The traces of the signals T and $W_a$ are separated in time by a sufficient period of time $\Delta t$, so that, when the driver signal T is applied to the field effect transistor 12, the transistor is already operating in the resistance region when the output signal $W_a$ is set from low to high. In the case of sufficient temporal spacing, channel degradation in the switching field effect transistor 12 in the first switching device 11 is very unlikely.

By contrast, although the temporal separation between the driver signal T and the signal $W_b$ of the second trace is still sufficient, it is far less distinct. In the case of the signal $W_b$, the field effect transistor 12 is also already operating in the resistance region, however, because the appropriate threshold voltage $U_{th}$ has already been exceeded on account of the sufficient signal drop in the driver signal T.

In the case of the output signal $W_c$, the time interval from the driver signal T is so short that the threshold voltage $U_{th}$ has still not been reached when the transmission signal $W_c$ changes from low to high, and the field effect transistor 12 in the first switching device 11 would, thus, be taken from the saturation region to the resistance region when turned on, i.e., when the threshold voltage $U_{th}$ is exceeded, under load.

Such a procedure would increase the likelihood of channel degradation and would, thus, increase the number of failures in relevant electronic components.

The invention counters such a risk with respect to signal profile $W_C$ by using a field effect transistor 12 whose threshold voltage $U_{th}$ is reduced further and/or a depletion mode type of field effect transistor 12.

The field effect transistor 12 can be configured to be normally-on or normally-off, depending on the form of the driver signal T—in terms of level and polarity.

I claim:

1. A decoding apparatus for transmitting a high voltage signal, comprising:
   a final decoder for switchably transmitting a transmission signal, said final decoder having a switching device;
   a transmission signal line device configured to supply the transmission signal to said final decoder;
   a driver signal line device configured to supply a driver signal to said final decoder; and
   an output signal line device configured to output an output signal from said final decoder;
   said switching device having at least one p-channel-conductive field effect transistor with a gate line, a source line, and an output;
   said driver signal line device connected to said gate line for applying the driver signal to said gate line;
   said transmission signal line device connected to said source line for applying the transmission signal to said source line;
   said output signal line device selectively connected to said output; and
   said at least one field effect transistor configured to selectively connect the output signal to said output signal line device through said output in response to a reset of the driver signal.

2. The decoding apparatus according to claim 1, wherein said at least one p-channel-conductive field effect transistor is a low VT field effect transistor.

3. The decoding apparatus according to claim 1, wherein:
   said transmission signal line device, said output signal line device, and said driver signal line device each have a plurality of individual lines for parallel transmission of a respective signal component, said plurality of individual lines including transmission signal lines, output signal lines, and driver signal lines;
   said switching device has a corresponding plurality of field effect transistors; and
   a respective gate line of a particular one of said plurality of field effect transistors is connected to a respective one of said driver signal lines and a respective source line of said particular one of said plurality of field effect transistors is connected to a respective one of said transmission signal lines for transmitting in parallel a respective component of the output signal through said output signal lines.

4. The decoding apparatus according to claim 3, wherein said plurality of field effect transistors is a plurality of normally-on, field effect transistors.

5. The decoding apparatus according to claim 3, including:
   a reset signal line device configured to supply a reset signal to said final decoder, said reset signal line device having a corresponding plurality of reset signal lines for supplying reset signal components; and
   a second switching device having a corresponding plurality of field effect transistors for resetting said output signal lines.

6. The decoding apparatus according to claim 1, wherein said at least one field effect transistor is at least one p-channel-conductive field effect transistor.

7. The decoding apparatus according to claim 6, wherein said at least one p-channel-conductive field effect transistor is at least one normally-on-type p-channel-conductive field effect transistor.

8. The decoding apparatus according to claim 1, including a reset signal line device configured to supply a reset signal to said final decoder.

9. The decoding apparatus according to claim 1, including a second switching device for resetting said output signal line device.

10. The decoding apparatus according to claim 9, wherein said second switching device is configured to reset said output signal line device to a zero potential.

11. A decoding apparatus for transmitting a high voltage signal, comprising:
    a final decoder for switchably transmitting a transmission signal, said final decoder having a switching device;
    a transmission signal line device configured to supply the transmission signal to said final decoder;
    a driver signal line device configured to supply a driver signal to said final decoder; and
    an output signal line device configured to output an output signal from said final decoder;
    said switching device having at least one depletion mode PFET field effect transistor with a gate line, a source line, and an output;
    said driver signal line device connected to said gate line for applying the driver signal to said gate line;
    said transmission signal line device connected to said source line for applying the transmission signal to said source line;
    said output signal line device selectively connected to said output; and
    said at least one field effect transistor configured to selectively connect the output signal to said output signal line device through said output in response to a reset of the driver signal.

12. The decoding apparatus according to claim 11, wherein said at least one depletion mode PFET field effect transistor has a low threshold voltage.

13. The decoding apparatus according to claim 11, including a reset signal line device configured to supply a reset signal to said final decoder.

14. The decoding apparatus according to claim 11, wherein at least one depletion-mode-type field effect transistor is at least one normally-on-type, depletion-mode-type field effect transistor.

15. The decoding apparatus according to claim 14, including a second switching device having a second field effect transistor with a second gate line and a second source line, said second gate line being configured to receive the reset signal and said source line being selectively connected to said output signal line device.

16. The decoding apparatus according to claim 17, including a second switching device for resetting said output signal line device.

17. The decoding apparatus according to claim 16, wherein said second switching device is configured to reset said output signal line device to a zero potential.

18. The decoding apparatus according to claim 13, including a second switching device having a second field effect transistor with a second gate line and a second source line, said second gate line being configured to receive the reset signal and said source line being selectively connected to said output signal line device.

19. The decoding apparatus according to claim 11, wherein:
   said transmission signal line device, said output signal line device, and said driver signal line device each have a plurality of individual lines for parallel transmission of a respective signal component, said plurality of individual lines including transmission signal lines, output signal lines, and driver signal lines;
   said switching device has a corresponding plurality of depletion-mode-type field effect transistors; and
   a respective gate line of a particular one of said plurality of depletion-mode-type field effect transistors is connected to a respective one of said driver signal lines and a respective source line of said particular one of said plurality of depletion-mode-type field effect transistors is connected to a respective one of said transmission signal lines for transmitting in parallel a respective component of the output signal through said output signal lines.

20. The decoding apparatus according to claim 19, wherein said plurality of depletion-mode-type field effect transistors is a plurality of normally-on, depletion-mode-type field effect transistors.

21. The decoding apparatus according to claim 19, including:
   a reset signal line device configured to supply a reset signal to said final decoder, said reset signal line device having a corresponding plurality of reset signal lines for supplying reset signal components; and
   a second switching device having a corresponding plurality of field effect transistors for resetting said output signal lines.

22. A decoding apparatus for transmitting a high voltage signal, comprising:
   a final decoder for switchably transmitting a transmission signal, said final decoder having a switching device;
   a transmission signal line device configured to supply the transmission signal to said final decoder;
   a driver signal line device configured to supply a driver signal to said final decoder; and
   an output signal line device configured to output an output signal from said final decoder;
   said switching device having at least one field effect transistor with a gate line, a source line, and an output, said at least one field effect transistor having a low threshold voltage;
   said driver signal line device connected to said gate line for applying the driver signal to said gate line;
   said transmission signal line device connected to said source line for applying the transmission signal to said source line;
   said output signal line device selectively connected to said output;
   said at least one field effect transistor configured to selectively connect the output signal to said output signal line device through said output in response to a reset of the driver signal; and
   a predecoder configured to receive and predecode a supplied address signal and to generate and supply a driver control signal to said driver signal line device.

23. The decoding apparatus according to claim 22, including a driver for generating the driver signal and for outputting the driver signal on said driver signal line device.

24. A decoding apparatus for transmitting a high voltage signal, comprising:
   a final decoder for switchably transmitting a transmission signal; and
   said final decoder having a switching device with at least one field effect transistor having a low threshold voltage, a gate line and a source line;
   said gate line configured to receive a driver signal;
   said source line configured to receive a transmission signal;
   said at least one field effect transistor configured to output an output signal in response to a reset of the driver signal; and
   predecoder configured to receive and predecode a supplied address signal and to generate and supply a driver control signal to said driver signal line device.

25. A decoding apparatus for transmitting a high voltage signal, comprising:
   a final decoder for switchably transmitting a transmission signal;
   said final decoder having a switching device with at least one depletion mode PFET transistor having a gate line and a source line;
   said gate line configured to receive a driver signal;
   said source line configured to receive a transmission signal; and
   said at least one field effect transistor configured to output an output signal in response to a reset of the driver signal.

* * * * *